United States Patent [19]
Pijnenburg et al.

[11] Patent Number: 4,870,511
[45] Date of Patent: Sep. 26, 1989

[54] DEVICE FOR DEMODULATING A FREQUENCY-MODULATED SIGNAL

[75] Inventors: Josephus A. Pijnenburg; Franciscus G. J. Van De Pavoordt, both of Eindhoven, Netherlands

[73] Assignee: U.S. Philips Corporation, New York, N.Y.

[21] Appl. No.: 118,092

[22] Filed: Nov. 5, 1987

[30] Foreign Application Priority Data

Nov. 28, 1986 [NL] Netherlands ............................ 8603036

[51] Int. Cl.⁴ ........................ G11B 20/06; G11B 15/14
[52] U.S. Cl. ........................................... 360/30; 360/64
[58] Field of Search .......................... 360/29, 30, 64, 67

[56] References Cited

U.S. PATENT DOCUMENTS 4,443,822  4/1984  Furrer ..................................... 360/64
4,559,567 12/1985  Maruichi et al. ..................... 360/64
4,704,642 11/1987  Namiki .................................. 360/64

Primary Examiner—Vincent P. Canney
Attorney, Agent, or Firm—Edward W. Goodman

[57] ABSTRACT

In order to reduce disturbances in a device for demodulating a frequency-modulated signal, which disturbances are caused by head-switching in a video recorder, a low-pass filter which is normally arranged between the demodulator (10) and the hold circuit (12) is relocated. The low-pass filter (23, 24), i.e. at least the capacitive element (24) of this filter, is arranged in the hold circuit (12), and, in particular, at least the capacitive element (24) of the low-pass filter (23, 24) being arranged in the main signal path after the switching means (18).

20 Claims, 5 Drawing Sheets

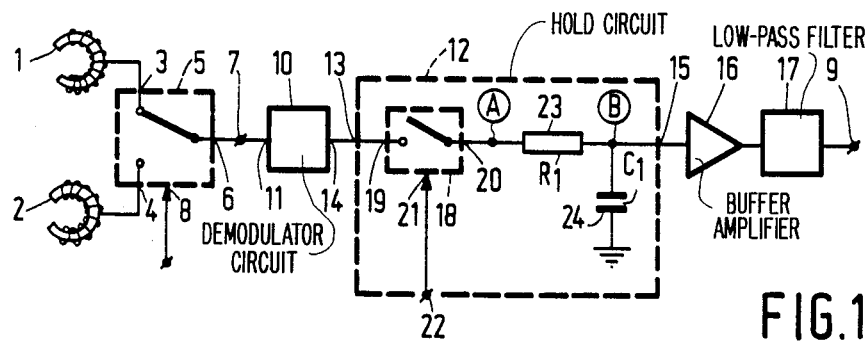
FIG.1
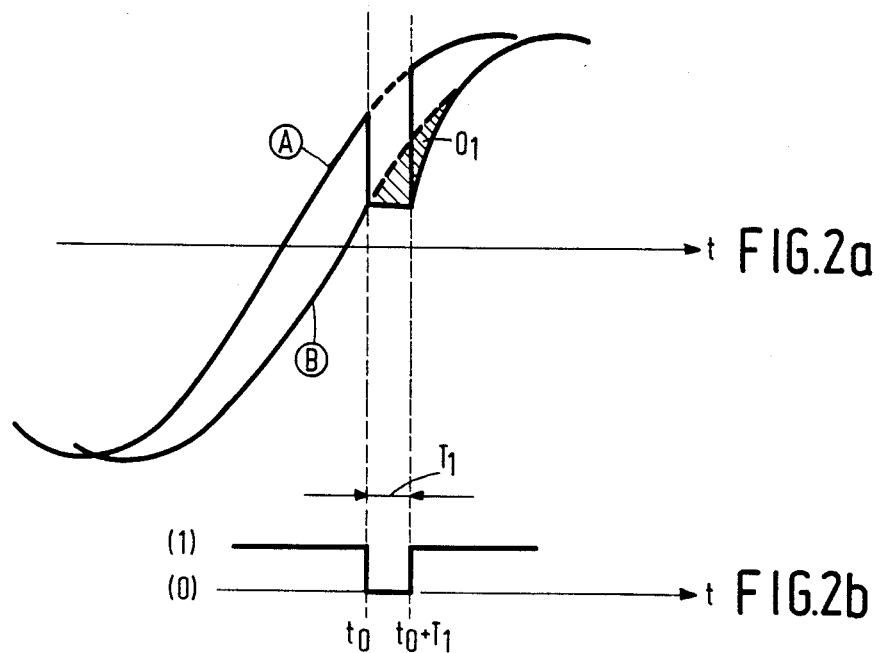
FIG.2a
FIG.2b

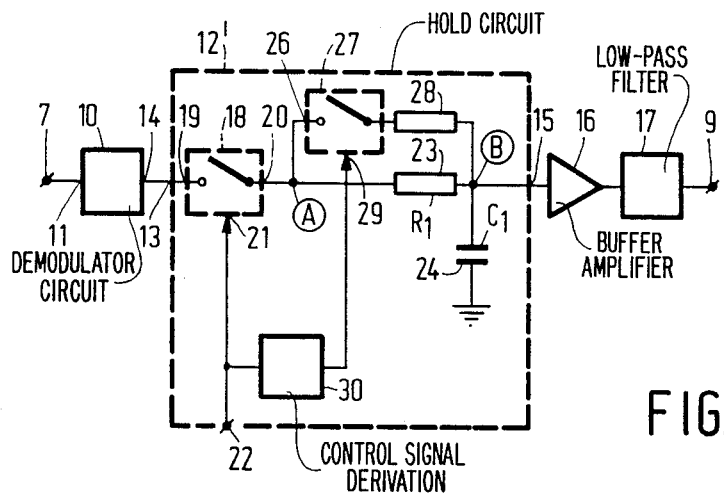
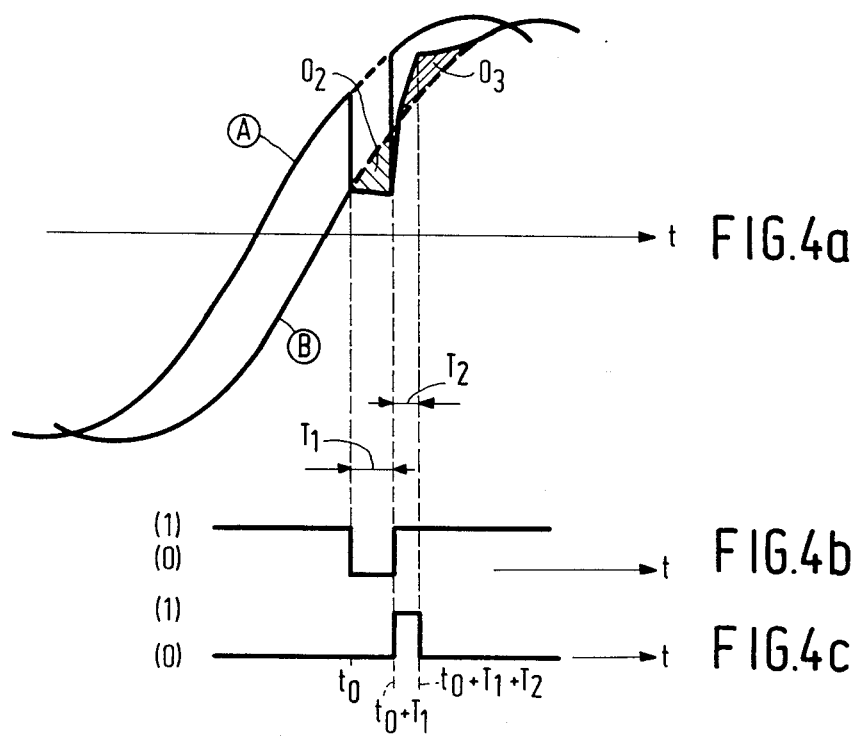

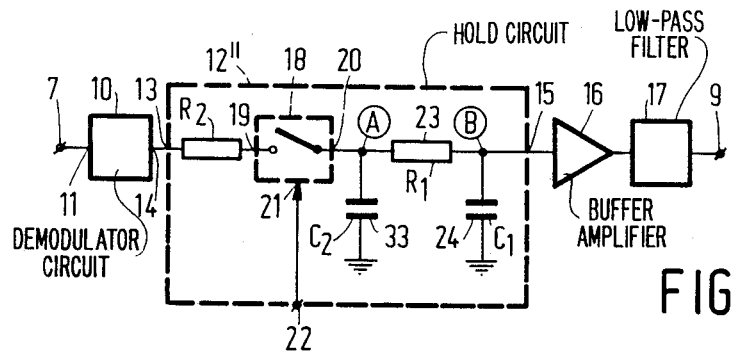
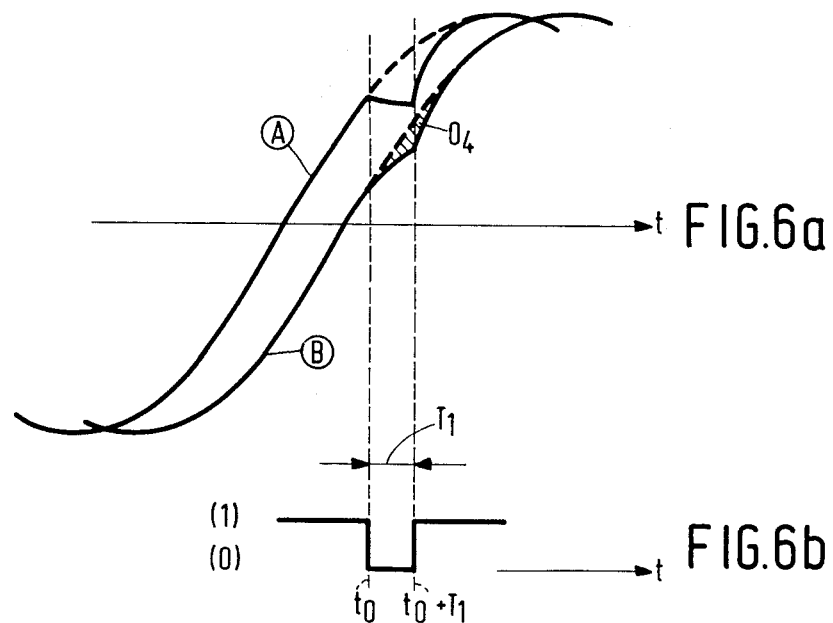

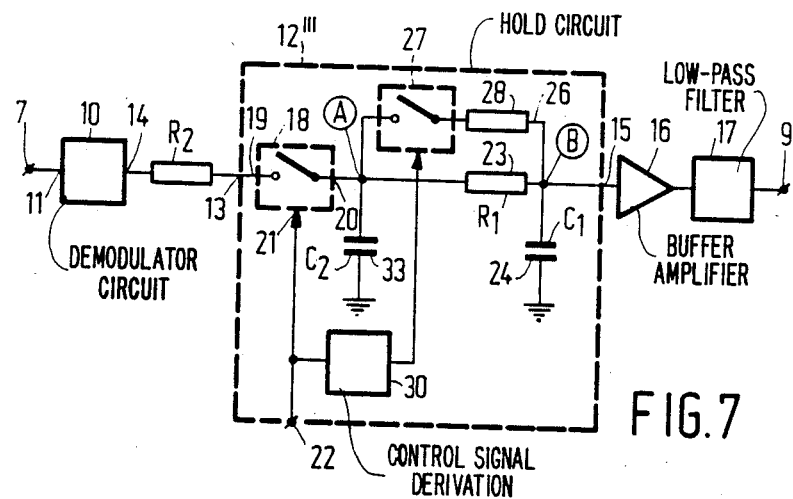
FIG.7
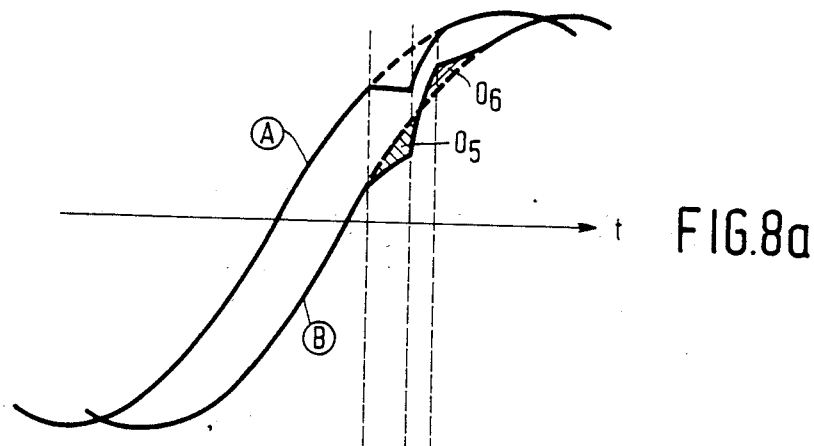
FIG.8a
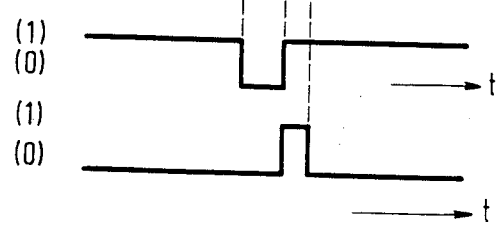
FIG.8b
FIG.8c

DEVICE FOR DEMODULATING A FREQUENCY-MODULATED SIGNAL

BACKGROUND OF THE INVENTION

The invention relates to a device for demodulating a frequency-modulated signal, having an input terminal for receiving the frequency-modulated signal and an output terminal for supplying a demodulated signal, a main signal path being provided between the input terminal and the output terminal, the device comprising:
a demodulator circuit, for demodulating the frequency-modulated signal, having an input coupled to the input terminal, and an output,
a low-pass filter comprising a capacitive element; and
a hold circuit having signal input, a control-signal input, and an output which is coupled to the output terminal, the hold circuit at least comprising first controllable switching means, having an input and an output respectively coupled to the input and the output of the hold circuit, and a control input coupled to the control signal input of the hold circuit, and a first capacitor coupled between the output of the hold circuit and a first point of constant potential, the hold circuit being constructed to at least substantially hold the signal applied to its input under the influence of a control signal applied to the control signal input, and the first switching means being constructed to interrupt the internal connection between its input and output under the influence of said control signal for a first tine interval $T_1$. Such a device may be incorporated in, for example, a video recorder for demodulating, after it has been read from a record carrier, a frequency-modulated audio signal recorded in the tracks on the record carrier, the device for this purpose further comprising two or more read heads arranged on a rotatable head drum, switching means having two or more inputs, an output and a control input, the switching means being constructed to couple one of the inputs to the output under the influence of a control signal to be applied to the control input, an output of each of the two or more read heads being coupled to an associated input of the two or more inputs of the switching means, and the output of the switching means being coupled to the input of the demodulator circuit.

The device is intended for precluding momentary disturbances in the input signal of the demodulator circuit. Momentary disturbances are to be understood to mean those disturbances which affect the regularity in said signal. Examples of these are drop-outs or drop-ins in the input signal of the demodulator circuit or phase shifts in this input signal which arise a result of switching over from reading the record carrier with one read head to reading with another read head (referred to as the "head-switch" operation). These momentary disturbances result in the operation of the demodulator circuit being disturbed, causing (audible) disturbances in the signal demodulated by the demodulator circuit.

The low-pass filter which is arranged directly after the demodulator circuit in the known device serves to remove spurious signal components produced in the demodulator circuit, such as intermodulation products, residual carrier wave components and noise above the audio band. A typical value for the cut-off frequency of such a filter is, for example, 100 to 150 kHz. The disadvantage of this low-pass filter is that the disturbances on the output of the demodulator circuit are expanded in time. For example, disturbances as a result of a head-switch operation, which may have lengths of approximately 4.5 μs, are expanded to lengths of approximately 8 to 10 μs by a low-pass filter having a cut-off frequency of the order of magnitude of 100 kHz. This means that the first switching means are (must be) open during the time interval $T_1$, which is approximately equal to said 8 to 10 μs. The purely periodic character of the actuation of the hold circuit (opening of the switching means) at the head-switching frequency in conjunction with the substantial length of the time interval $T_1$ give rise to a very annoying contribution in the output signal of the device.

SUMMARY OF THE INVENTION

It is the object of the invention to provide a device which substantially reduces spurious components in the signal on the output terminal.

To this end the device in accordance with the invention is characterized in that at least the capacitive element of the low-pass filter is arranged in the hold circuit and is arranged in the main signal path after the first controllable switching means, in that a first impedance is arranged in the connection from the input of the hold circuit to the terminal of the capacitor which is not coupled to the point of constant potential, and in that the low-pass filter at least comprises said first impedance and the capacitive element and the first capacitor forms part of the capacitive element.

The invention is based on the recognition of the fact that by arranging the capacitive element of the low-pass filter in the hold circuit, the hold time (time interval $T_1$) can be reduced substantially. By arranging the capacitive element of the low-pass filter in the main signal path after the first switching means and making the first capacitor form part of the capacitive element of the low-pass filter; it is achieved that the disturbances are not expanded in time in the main signal path before the first switching means, enabling the hold time (the time interval $T_1$) to be reduced substantially. In the above example, a hold time of 4 to 5 μs is obtained, which is substantially shorter than the hold time of approximately 8 to 10 μs necessary in the known device. The shorter hold time results in a substantial reduction of the disturbance in the output signal of the device. Moreover, the number of components of the demodulator circuit can be reduced substantially. The first impedance may be realized, for example, by the parasitic resistance of the first switching means, so that no separate impedance is needed.

It is to be noted that European Patent Application No. 180,717 describes a circuit which also aims at reducing disturbances in the output signal as a result of head switching. However, the operation of the circuit is based on a different principle. Moreover, the capacitive element of the low-pass filter is not arranged in the hold circuit.

The device may be characterized further in that the first impedance is coupled between the output of the first switching means and the terminal of the capacitor which is not coupled to the point of constant potential, and in that a second capacitor is arranged between the output of the first switching means and the point of constant potential. This may lead to a further reduction of residual disturbances caused by the switching means being open for said shorter hold time. Arranging a second impedance in the connection from the input of the hold circuit to the terminal of the second capacitor which is not coupled to the point of constant potential, provides a further reduction of high-frequency noise and intermodulation components caused by the demodulator. This second impedance may be constituted by, for example, the parasitic resistance of the first switching means, so that no separate impedance is needed.

The device may be characterized further in that an auxiliary signal path is arranged in parallel with at least the first impedance, which auxiliary signal path comprises second controllable switching means having an input and an output and being constructed to provide an internal coupling from this point to this output for at least a second time interval $T_2$ following the first time interval $T_1$. This enables an even further reduction of disturbances to be obtained.

The device may be characterized further in that the two ends of the first impedance are respectively coupled to the inverting input and the non-inverting input of a differential amplifier having an output coupled to the output of the hold circuit via a series arrangement of second switching means and a voltage-to-current converter, and in that the junction point between the second switching means and the voltage-to-current converter is coupled to the point of constant potential via a second capacitor. In this way the device in accordance with the invention is provided with an extrapolator (known per se) by means of which the disturbance can be reduced even further.

BRIEF DESCRIPTION OF THE DRAWINGS

Embodiments of the invention will now be described in more detail, by way of example, with reference to the accompanying drawings. Elements bearing the same reference numerals in different Figures are identical.

In the drawings:

FIG. 1 shows a first embodiment;

FIGS. 2a and b show a number of signals, as a function of time, appearing at a number of points in the circuit of FIG. 1;

FIG. 3 shows a second embodiment;

FIGS. 4a, b and c show a number of signals, as a function of time, appearing at a number of points in the circuit of FIG. 3;

FIG. 5 shows a third embodiment;

FIGS. 6a and b show a number of signals, as a function of time, appearing at a number of points in the circuit of FIG. 5;

FIG. 7 shows a fourth embodiment; and

FIGS. 8a, b and c show a number of signals, as a function of time, appearing at a number of points in the circuit of FIG. 7.

DETAILED DESCRIPTION OF THE INVENTION

Figure 1A:
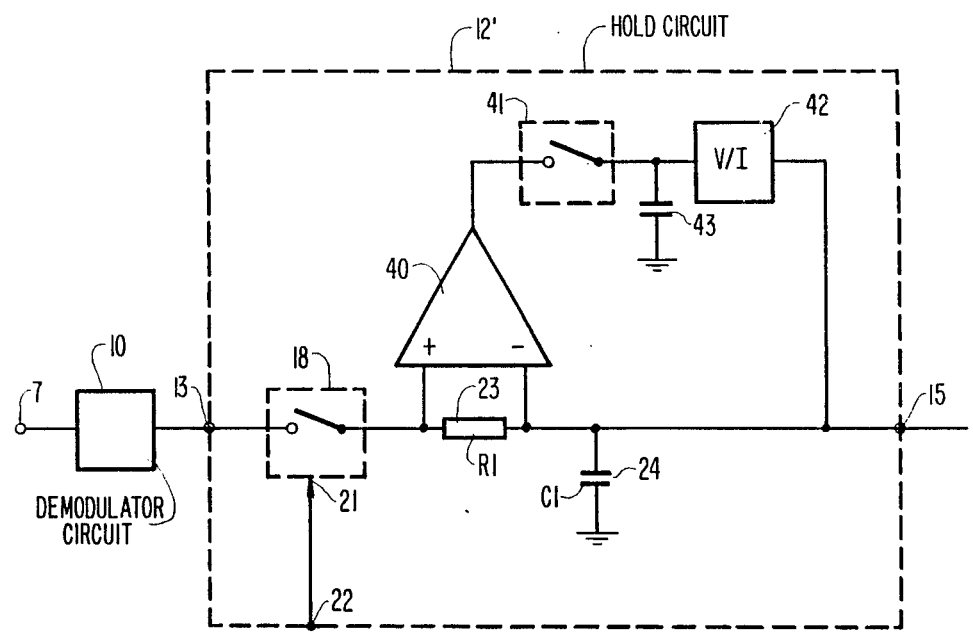
FIG. 1a shows the first embodiment of FIG. 1 having an extrapolator circuit coupled therein.

FIG. 1 shows an embodiment of the invention used in a video recorder. A number (in the present case two) of read heads 1 and 2 are arranged on a rotatable head drum (not shown) and are respectively coupled to inputs 3 and 4 of switching means 5. The output 6 of the switching means is coupled to the input terminal 7 of the device. The switching means 5 are constructed to couple one of the inputs 3, 4 to the output 6 under the influence of a control signal to be applied to a control input 8. This control signal may be supplied by a control unit (not shown), which can derive this control signal from an internal clock in the control unit, which clock can be synchronized in some way with the signal read from a magnetic record carrier (not shown) by the read heads.

The input terminal 7 of the device, to which the frequency-modulated signal read from the record carrier is applied, is coupled to an output terminal 9 via a main signal path. The main signal path in FIG. 1 comprises a demodulator circuit 10 whose input 11 is coupled to the input terminal 7, a first low-pass filter, to be described hereinafter, and a hold circuit 12 having a control signal input 22, an input 13 coupled to the output 14 of the demodulator circuit 10, and an output 15. The output 15 is coupled to a second low-pass filter 17 via a buffer amplifier 16 which ensures that the circuits coupled in the main signal path after the buffer amplifier 16 do not load a first (or hold) capacitor 24. This second low-pass filter 17 ensures that spurious components outside the audio band cannot reach the following circuitry. The output of the second low-pass filter 17 is coupled to the output terminal 9.

The hold circuit 12 comprises first controllable switching means 18, having an input 19 and an output 20, which are respectively coupled to the input 13 and the output 15 of the hold circuit. The switching means 18 further comprise a control input 21 coupled to the control signal input 22. The output 2o of the controllable switching means 18 is coupled to the output 15 of the hold circuit 12 via a first impedance 23 in the form of a resistor $R_1$. Further, the output 15 is coupled to a point of constant potential (ground) via a first capacitor 24.

In the known devices for demodulating a frequencymodulated signal a low-pass filter is arranged between the output 14 of the demodulator circuit 10 and the input 13 of the hold circuit 12, and the impedance 23 is not present. This low-pass filter has a cut-off frequency of approximately 100 to 150 kHz and is intended to remove spurious signal components such as intermodulation products, residual carrier waves and noise above the audio band.

The disadvantage of this low-pass filter is that it causes and expansion in time of the disturbances in the output signal of the demodulator circuit 10 which result from the change-over in the switching means 5 from reading with one read head, for example the read head 1, to reading with other read head, in the present case the read head 2. Consequently, the switching means 18 must be open for a comparatively long time. The cut-off frequency of 100 to 150 kHz of the low-pass filter cannot be selected (much) lower because this would result in the disturbances being spread over an even longer time. Therefore, it is proposed to arrange at least the capacitive section of the first low-pass filter in the main signal path after the switching means 18. Thus, the capacitive element of the first low-pass filter is in fact arranged in the hold circuit 12. In the embodiment shown in FIG. 1, the first low-pass filter comprises the first impedance (resistor $R_1$) 23 and the first capacitor 24 ($C_1$), which moreover functions as the hold capacitor for the hold circuit 12.

Since at least the capacitive section of the first low-pass filter 23, 24 is arranged after the switching means 18 in the main signal path, the disturbances in the output signal of the demodulator circuit 10 are not expanded in time. This is because the energy content of the disturbance cannot reach the capacitive element of the first low-pass filter on account of the switching means being open.

Therefore, the switching means 18 needs to be open for a shorter time (the time interval $T_1$, see FIG. 2b), which means a smaller disturbance in the output signal on the output terminal 9. As a result of this, $T_1$ is reduced from approximately 8 to 10 μs to 4 to 5 μs, as already stated in the foregoing.

The operation of the circuit shown in FIG. 1 will now be explained by means of FIG. 2. FIG. 2a shows two signals A and B as a function of time, which signals appear at points A and B in FIG. 1. As a result of the delay caused by the low-pass filter 23, 24, the signal at point B slightly lags the signal on point A. FIG. 2b shows the control signal applied to the control signal input 21 of the switching means via the control signal input 22. A control signal which is logic "1" means that the switching means 18 is closed and a control signal which is logic "0" means that the switching means 18 is open.

At the instant $t=t_0$, switching is effected from reading with one read head to reading with the other read head. The phase shift thus produced in the input signal of the demodulated circuit 10 ensures that in the output signal of the demolator circuit a disturbance occurs for a specific time after the instant $t_0$. This disturbance has a maximum length of $T_1$. During the time interval $T_1$ after $t=t_0$, the switching means 18 is open. In FIG. 2b this is visible because the control signal is logic "0" during this time interval. During this time interval, the voltage across the capacitor 24 remains substantially constant and decreases only slightly as a result of leakage, see Figure 2a, curve B.

After opening of the switching means 18, the voltage at point A in FIG. 1 decreases to the value of the voltage at point B. After closure of the switching means 18 at the instant $t=t_0+T_1$, the voltage at point A in the circuit of FIG. 1 changes to the value of the voltage instantaneously appearing at the output 14 of the demodulator circuit 10. After the instant $t=t_0+T_1$, the signal at point B in FIG. 1 will slowly change to the dashed prolongation of the curve B from $t=t_0$. The hatched areea $0_1$ enclosed by the actual curve B from $t=t_0$ and the dashed extension of the curve B to $t=t_0$ is the disturbance ultimately occurring in the output signal on the output 15 of the hold circuit 12. However, this disturbance is smaller than the disturbance which would occur in the known device in which the low-pass filter is arranged in the main signal path before the switching means 18. If desired, the resistor 23 may be arranged before instead of after the switching means 18. This does not affect the operation of the circuit.

The low-pass filter 17 has a cut-off frequency of approximately 20 kHz. Depending on the degree of attenuation to be attained for frequencies above 20 kHz a first, second or higher order filter characteristic may be selected for the filter 17.

For a further reduction of disturbances as a result of opening of the first switching means, it is known to provide an extrapolator. It is also possible to use such an extrapolator in the circuit of FIG. 1. One example of an extrapolator will be described hereinafter with reference to FIG. 1a. The two ends of the impedance 23 are respectively coupled to the inverting input and the non-inverting input of a differential amplifier 40. The output of this differential amplifier 40 is coupled to the output 15 of the hold circuit via a series arrangement of second switching means 41 and a voltage-to-current converter 42. Moreover, a capacitor 43 is arranged between the output of the second switching means 41 and the point of constant potential.

FIG. 3 shows an embodiment which bears much resemblance to the embodiment shown in FIG. 1. The difference is that in the embodiment shown in FIG. 3, an auxiliary signal path 26 is arranged in parallel with at least the first impedance 23 (resistor R) and that the read heads 1, 2 and the switching means 5 are dispensed with. The auxiliary signal path 26 comprises second controllable switching means 27. Further, another second impedance (resistor) 28 is arranged in the auxiliary signal path 26 in series with the second switching means 27. The second switching means 27 is controlled by a control signal applied to a control input 29 of the second switching means 27. When the control signal is logic "1", the second switching means 27 is closed and when the control signal is logic "0", the second switching means 27 is opened.

The control signal input 22 of the hold circuit 12' is coupled to the control input 29 via a block 30. The operation of the circuit shown in FIG. 3, and in particular the operation of the block 30, will be described with reference to FIG. 4.

FIG. 4a again shows the signals at point A and B in the circuit of FIG. 3 as a function of time, and FIGS. 4b and 4c show the control signals applied to the control inputs 21 and 29 of the first and second switching means 18 and 27, respectively.

The first switching means 18 operates in the same way as described with reference to FIGS. 1 and 2. The signal A in FIG. 4a and the control signal in FIG. 4b are consequently identical to the relevant signals in FIGS. 2a and 2b, respectively.

If at the instant $t=t_0+T_1$ the first switching means 18 is closed again, the block 30 derives the control signal, see FIG. 4c, causing the second switching means 27 to be briefly closed for a time interval, $T_1$. During this time interval the voltage at the junction point between the second switching means 27 and the resistor 28 is equal to that at the point A. Consequently, the voltage at point B will increase and intersect the dashed prolongation of the curve B from $t=t_0$. After the second switching means 27 has been opened, the voltage on point B returns to the dashed prolongation of the curve B from $t=t_0$.

The hatched areas $0_2$ and $0_3$, enclosed by the actual curve B respectively below and above the dashed prolongation and the dashed line itself, again represent the disturbance ultimately appearing on the output 15. Since the disturbance now comprises two disturbance components on opposite sides of the prolongation, this disturbance is less perceptible and is therefore less annoying. Preferably, the circuit of FIG. 3 should be dimensioned in such a way that the areas $0_2$ and $0_3$ are of the same order of magnitude.

For the operation of the circuit, it is irrelevant whether the auxiliary signal path 26 is arranged in parallel with the resistor 23 only or is arranged in parallel both with the first switching means 18 and the resistor 23. Moreover, the resistor 23 may again be arranged before the switching means 18.

FIG. 5 shows yet another embodiment. The difference with the embodiment of FIG. 1 is that in the present case a second capacitor 33 ($C_2$) is arranged between the output 20 of the first switching means 18 and the point of constant potential ground.

In the circuit from the output 14 of the demodulator circuit 10 to point A, a second impedance is arranged. This may be a separate resistor, for example a resistor $R_2$, but if desired the internal resistance of the first switching means 18 may be utilized for this purpose.

The operation of the circuit of FIG. 5 is again illustrated by means of the signals shown in FIGS. 6a and b. FIG. 6a again shows the signals at point A and B in FIG. 5 and FIG. 6b shows the control signal applied to the switching means 18.

The hatched area $0_4$ between the curve B and the dashed prolongation from $t = t_0$ represents the disturbance relative to the desired signal, which disturbance appears on the output 15 of the hold circuit 12''. If the time constant of the RC filter comprising the elements $R_2$, $C_2$ is smaller than the time constant $R_1 C_1$ of the filter of FIG. 1, the area $0_4$ in FIG. 6 may be smaller than the area $0_1$ in FIG. 2. This means that the disturbance in the circuit arrangement shown in FIG. 5 is smaller than the disturbance in the arrangement of FIG. 1.

FIG. 7 shows still another embodiment. In fact, it shows the embodiment of FIG. 5 extended by the auxiliary signal path 26 of FIG. 3. FIG. 8a again shows the signals at points A and B in FIG. 7 as a function of time and FIGS. 8b and c again show the control signals for the first and second switching means 18 and 27, respectively.

In FIG. 8a, the curve B illustrates a behavior which bears much resemblance to that of the curve B in FIG. 4a. A disturbance occurs which results in excursions of the desired signal towards a smaller signal amplitude (the area $0_5$) and towards a larger signal amplitude (the area $0_6$). As already stated with reference to FIG. 4, this disturbance in FIG. 8 is also less perceptible and consequently less annoying than the disturbance obtained when the circuit of FIG. 5 is used. Moreover, the circuit of FIG. 7 produces less disturbance than the circuit of FIG. 3, which will become apparent when the areas $0_2$ $0_3$ are compared with $0_5$ and $0_6$, respectively.

It is to be noted that the invention is not limited to the embodiment shown. The invention also relates to those devices which differ from the embodiments shown in respects which are irrelevant to the invention. For example, it is possible to split the first impedance 23 ($R_1$) in FIGS. 3 to 7 into two parts, to arrange one part between the output 20 of the switching means 18 and point A, and to arrange the second part between points A and B. In the circuit arrangement of FIG. 7 the auxiliary signal path 26 may then be arranged in parallel with only the second part of $R_1$.

We claim:

1. A device for demodulating a frequency-modulated signal, having an input terminal for receiving the frequency-modulated signal and an output terminal for supplying a demodulated signal, a main signal path being provided between the input terminal and the output terminal, comprising:
    a demodulator circuit, for demodulating said frequency-modulated signal, having an input coupled to said input terminal, and an output;
    a low-pass filter comprising a capacitive element; and
    a hold circuit having a signal input, a control signal input, and an output coupled to said output terminal, said hold circuit at least comprising first controllable switching means, having an input and an output coupled, respectively, to said signal input and said output of said hold circuit, and a control input coupled to said control signal input of said hold circuit, and a first capacitor coupled between said output of said hold circuit and a first point of constant potential, said hold circuit being constructed to at least substantially hold a signal applied to its input under the influence of a control signal applied to said control signal input, and said first controllable switching means being constructed to interrupt an internal connected between its input and its output under the influence of said control signal for a first time interval $T_1$, characterized in that at least said capacitive element of said low-pass filter is arranged in said hold circuit and is arranged in said main signal path after said first controllable switching means, in that a first impedance is arranged in said main signal path between said input of said hold circuit and a terminal of the capacitor which is not coupled to said point of constant potential, and in that said low-pass filter at least comprises said first impedance and said capacitive element, said first capacitor forming part of said capacitive element.

2. A device as claimed in claim 1, characterized in that said first impedance is coupled between said output of said first switching means and said terminal of said capacitor which is not coupled to said point of constant potential, and in that a second capacitor is arranged between said output of said first controllable switching means and said point of constant potential.

3. A device as claimed in claim 2, characterized in that a second impedance is arranged in said main signal path between said input of said hold circuit and a terminal of said second capacitor which is not coupled to said point of constant potential.

4. A device as claimed in claim 1, characterized in that an auxiliary signal path is arranged in parallel with at least said first impedance, said auxiliary signal path comprising second controllable switching means having an input and an output and providing an internal coupling from this input to this output for at least a second time interval $T_2$ following said first time internal $T_1$.

5. A device as claimed in claim 4, characterized in that said auxiliary signal path comprises a series arrangement of said second controllable switching means and a second impedance.

6. A device as claimed in claim 1, characterized in that the two ends of said first impedance are coupled, respectively, to an inverting input and a non-inverting input of a differential amplifier having an output coupled to said output of said hold circuit via a series arrangement of second switching means and a voltage-to-current converter, a junction point between said second switching means and said voltage-to-current converter being coupled to said point of constant potential via a second capacitor.

7. A device as claimed in claim 1, characterized in that said device is incorporated in a video recorder for demodulating a frequency-modulated (audio) signal recorded on a record carrier after it has been read from said record carrier, said device further comprising:
    two or more read heads arranged on a rotatable head drum ; and
    switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

8. A device as claimed in claim 2, characterized in that an auxiliary signal path is arranged in parallel with at least said first impedance, said auxiliary signal path comprising second controllable switching means having an input and an output and providing an internal coupling from this input to this output for at least a second time interval $T_2$ following said first time interval $T_1$.

9. A device as claimed in claim 3, characterized in that an auxiliary signal path is arranged in parallel with at least said first impedance, said auxiliary signal path comprising second controllable switching means having an input and an output and providing an internal coupling from this input to this output for at least a second time interval $T_2$ following said first time interval $T_1$.

10. A device as claimed in claim 8, characterized in that said auxiliary signal path comprises a series arrangement of said second controllable switching means and a second impedance.

11. A device as claimed in claim 9, characterized in that said auxiliary signal path comprises a series arrangement of said second controllable switching means and a third impedance.

12. A device as claimed in claim 2, characterized in that said device is incorporated in a video recorder for demodulating a frequency-modulated (audio) signal recorded on a record carrier after it has been read from said record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of the switching means, and said output of said switching means being coupled to said input of said demodulator circuit.

13. A device as claimed in claim 3, characterized in that said device is incorporated in a video recorder for demodulating a frequency-modulated (audio) signal recorded on a record carrier after it has been read from said record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

14. A device as claimed in claim 4, characterized in that said device is incorporated in a video recorder for demodulating a frequency-modulated (audio) signal recorded on said record carrier after it has been read from said record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

15. A device as claimed in claim 5, characterized in that said device is incorporated in a video recorder for demodulating a frequency-modulated (audio) signal recorded on said record carrier after it has been read from a record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

16. A device as claimed in claim 6, characterized in that said device is incorporated in a video recorder for demodulating a frequency-modulated (audio) signal recorded on a record carrier after it has been read from said record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

17. A device as claimed in claim 8, characterized in that said device is incorporated in a video recorder for demodulating a frequency-modulated (audio) signal recorded on a record carrier after it has been read from said record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

18. A device as claimed in claim 9, characterized in that said device is incorporated in a video recorder for demodulating a frequency-modulated (audio) signal recorded on a record carrier after it has been read from a record carrier, said device further comprising:
two or more read heads arranged on a rotatable head drum ; and
switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

19. A device as claimed in claim 10, characterized in that said device is incorporated in a video recorder for demodulating a frequency-modulated (audio) signal recorded on a record carrier after it has been read from said record carrier, said device further comprising:

two or more read heads arranged on a rotatable head drum; and switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

20. A device as claimed in claim 11, characterized in that sad device is incorporated in a video recorder for demodulating a frequency-modulated (audio) signal recorded on a record carrier after it has been read from said record carrier, said device further comprising:

two or more read heads arranged on a rotatable head drum; and switching means having two or more inputs, an output and a control input, said switching means coupling one of said inputs to said output under the influence of a control signal applied to said control input, an output of each of said two or more read heads being coupled to an associated input of said two or more inputs of said switching means, and said output of said switching means being coupled to said input of said demodulator circuit.

* * * * *